United States Patent [19]

Stans et al.

[11] Patent Number: 5,570,027

[45] Date of Patent: Oct. 29, 1996

[54] PRINTED CIRCUIT BOARD TEST APPARATUS AND METHOD

[75] Inventors: Louis J. Stans, Setauket; Christopher F. Lynch, White Plains, both of N.Y.

[73] Assignee: Photocircuits Corporation, Glen Cove, N.Y.

[21] Appl. No.: 425,080

[22] Filed: Apr. 19, 1995

[51] Int. Cl.$^6$ .................................................. G01R 31/08
[52] U.S. Cl. ........................ 324/523; 324/537; 324/530
[58] Field of Search .............................. 324/66, 73.1, 95, 324/500, 501, 519, 530, 537, 543, 672, 679

[56] References Cited

U.S. PATENT DOCUMENTS

| | | |
|---|---|---|
| Re. 32,625 | 3/1988 | Schwarz et al. . |
| 3,392,324 | 7/1968 | Hermann et al. . |
| 3,414,811 | 12/1968 | Carter . |
| 4,697,142 | 9/1987 | Frushour . |
| 4,739,258 | 4/1988 | Schwarz . |
| 4,743,847 | 5/1988 | Frushour . |
| 4,777,432 | 10/1988 | Doemens et al. ........................ 324/459 |
| 4,835,466 | 5/1989 | Maly et al. . |
| 4,837,502 | 6/1989 | Ugenti ..................................... 324/523 |
| 4,857,833 | 8/1989 | Gonzalez et al. . |
| 4,908,576 | 3/1990 | Jackson ................................... 324/73.1 |
| 4,922,184 | 5/1990 | Rosenstein et al. . |
| 5,030,905 | 7/1991 | Figal . |
| 5,162,742 | 11/1992 | Atkins et al. . |
| 5,217,304 | 6/1993 | Ortiz . |
| 5,256,975 | 10/1993 | Mellitz et al. ........................... 324/519 |
| 5,268,645 | 12/1993 | Prokoff et al. ........................... 324/537 |
| 5,278,495 | 1/1994 | Beaton et al. . |

Primary Examiner—Michael Tokar
Attorney, Agent, or Firm—Nixon, Hargrave, Devans & Doyle

[57] ABSTRACT

The apparatus and method operate by first generating a set of amplitudes for a constant current pulse. Each amplitude in the set is associated with one conductor on the reference printed circuit board and represents the amplitude which generates a determined voltage rise in that one conductor that is within a set range of a desired voltage rise for that one conductor. Each determined voltage rise representing the difference between a first voltage drop reading and a subsequent voltage drop reading taken across each conductor while the constant current pulse is applied. Once the set of amplitudes is generated, the apparatus and method generate a set of test voltage rises. Each test voltage rise is associated with one conductor on the test printed circuit board and represents the difference between the first and the subsequent voltage drop readings taken across that one conductor when the constant current pulse with the amplitude from the set of amplitudes for the corresponding conductor on the reference printed circuit board is applied to that one conductor. Once the test voltage rises are generated, then the apparatus and method compare the test voltage rise for each conductor on the test printed circuit board against the desired voltage rise for the corresponding conductor on the reference printed circuit board to determine if the test voltage rise exceeds the desired voltage rise. If the test voltage rise exceeds the desired voltage rise, then the apparatus and method identity the conductor as defective. The test apparatus and method may multiply each reference voltage rise in the set of reference voltage rises by a set factor to establish a table of adjusted reference voltage rises and then use the adjusted set of reference voltage rises when comparing and evaluating the test voltage rises.

26 Claims, 3 Drawing Sheets

PRINTED CIRCUIT BOARD TEST APPARATUS AND METHOD

FIELD OF THE INVENTION

This invention relates generally to inspecting primed circuit boards and more particularly to an apparatus and method for automatically identifying defective conductors including plated through holes and multilayer, inner layer, interconnects on printed circuit boards which have a reduced cross sectional area over part or all of their length.

BACKGROUND OF THE INVENTION

In the manufacturing process for primed circuit boards, a layer of conductive material is applied by various methods onto each printed circuit board substrate and then the conductors on the printed circuit board are imaged and etched. The conductors are used to interconnect components which will be later connected to the printed circuit board. During the manufacturing and or etching process, defects in the conductors and plated through holes (PTH) sometimes occur. Since correcting printed circuit boards at the site of the consumer is expensive, manufacturers attempt to identify and if possible correct the defective conductors before the printed circuit boards are sent out.

The manner in which defects in conductors can occur include, over etching, thin plating, handling scratches, "mouse bites," and voids or defective interconnects in PTHs. The types of defects which can occur include open circuits in the conductor or PTH, areas of reduced cross-sectional area, known as "necked-down" regions, in the conductor, and areas of reduced cross-sectional area along the entire length of the conductor. Other detectable defects include partial voiding in PTH and defective inner layer interconnects on multilayer PCBs.

One example of a conductor C1 with a necked down region NDR1 on a printed circuit board PCB1 is illustrated in top and side views, shown in FIGS. 1(*a*–*b*). At the necked down region NDR1, the thickness of conductor C1 is substantially reduced. Since the current carrying capacity a conductor is dependent on the cross-sectional area of the conductor, a reduced cross-sectional area along a portion or the entire length of the conductor will effect the conductor's capacity to carry current. As a given current flows through a conductor with a reduced cross sectional area over part or all of its length, the higher current density in the section of reduced area will result in greater power dissipation in that area and a corresponding larger temperature rise in that area. Eventually, the conductor with a necked down region or a reduced cross-sectional area along its entire length may burn out from the thermal stress. Defect areas in conductors where there is an open circuit are easy to detect, but defects in conductors where the region is necked down as shown in FIGS. 1(*a*–*b*) or where the entire length is reduced are difficult to detect. Standard methods for electrical testing of PCBs only reveal complete open or short circuits.

Existing techniques for detecting partially defective conductors are imprecise and often fail to identify partially defective conductors. For example, one prior technique identifies defective conductors by applying a high current pulse to each conductor on the printed circuit board to burn open any defective conductors. However, this technique is imprecise because some conductors which are defective will not be identified because the high current pulse is insufficient to burn open the defective conductor. Another technique applies a continually increasing current signal to each conductor on the printed circuit board, measures the voltage drop across each conductor, and monitors the voltage and current waiting for the voltage to start varying nonlinearly with the current signal. Again this technique is imprecise because some conductors which are defective will not be identified because the nonlinear fluctuation of the voltage with respect to the current may not be sufficient to identify a defective conductor. Additionally, prior techniques often are unable to accurately control the amplitude or magnitude and duration of the current pulses used to test conductors and as a result conductors and printed circuit boards which are acceptable are damaged.

SUMMARY OF INVENTION

A test apparatus which provides an accurate automatic analysis of conductors on a printed circuit board includes a control unit which is coupled to a current source, a measuring unit, a plurality of switches, and connectors. In one embodiment, the apparatus and method operate by first generating a set of reference voltage rises. Each reference voltage rise in the set is associated with one conductor on the reference printed circuit board and represents the difference between a first voltage drop reading and a subsequent voltage drop reading taken across that one conductor while a constant current pulse is applied. Once the set of reference voltage rises is generated, then the apparatus and method generate a set of test voltage rises. Each test voltage rise in the set is associated with one conductor on the test printed circuit board and represents the difference between the first and the subsequent voltage drop readings taken across that one conductor while the constant current pulse is applied. When the sets of reference and test voltage rises are generated, then the apparatus and method compare the test voltage rise for each conductor on the test printed circuit board against the reference voltage rise for the corresponding conductor on the reference printed circuit board to determine if the test voltage rise exceeds the reference voltage rise. If the test voltage rise exceeds the reference voltage rise, then the apparatus and method identify the conductor as defective. The apparatus and method may multiply each reference voltage rise in the set of reference voltage rises by a set factor to establish a table of adjusted reference voltage rises and then use the adjusted set of reference voltage rises when comparing and evaluating the test voltage rises. This permits the operator to dynamically adjust the parameters for identifying defective conductors and allows for manufacturing tolerances normally associated with the manufacturing process.

In an alternative embodiment, the apparatus and method operate by first generating a set of amplitudes for a constant current pulse. Each amplitude in the set is associated with one conductor on the reference printed circuit board and represents the amplitude which generates a determined voltage rise in that one conductor that is within a set range of a desired voltage rise for that one conductor. Each determined voltage rise representing the difference between a first and a subsequent voltage drop readings taken across each conductor while the constant current pulse is applied. Once the set of amplitudes is generated, the apparatus and method generate a set of test voltage rises. Each test voltage rise is associated with one conductor on the test printed circuit board and represents the difference between the first and the subsequent voltage drop readings taken across that one conductor when the constant current pulse with the amplitude from the set of amplitudes for the corresponding conductor on the reference printed circuit board is applied to that one conductor. Once the test voltage rises are generated, then the apparatus and method compare the test voltage rise for each conductor on the test printed circuit board against the desired voltage rise for the corresponding conductor on the reference printed circuit board to determine if the test voltage rise exceeds the desired voltage rise. If the test voltage rise exceeds the desired voltage rise, then the apparatus and method identify the conductor as defective. Again, the apparatus and method may multiply each reference voltage rise in the set of reference voltage rises by a set factor to establish a table of adjusted reference voltage rises and then use the adjusted set of reference voltage rises when comparing and evaluating the test voltage rises.

With the present invention, an accurate automatic analysis for defects in conductors on printed circuit boards can be carried out. Conductors with open circuits, areas of reduced cross-sectional, and areas of reduced cross-sectional area along their entire length can be easily identified. The apparatus and method will not damage other acceptable conductors or the printed circuit boards being tested and is dynamic allowing the operator to adjust the parameters for identifying defective conductors to the particular printed circuit boards being inspected.

DETAILED DESCRIPTION

Figure 1A:
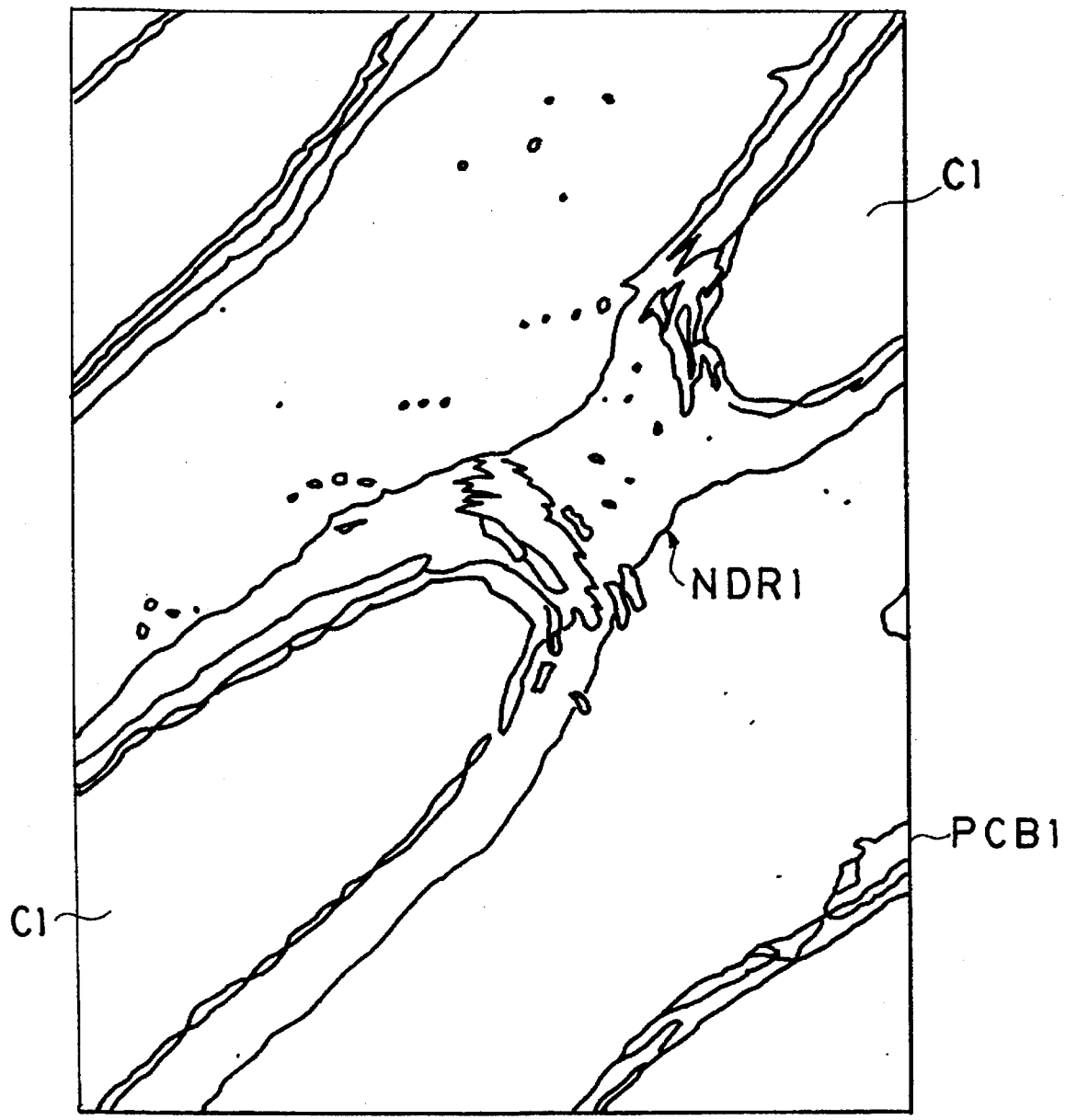
FIG. 1(a) is a top view of a conductor on a printed circuit board with a necked down region.
Figure 1B:
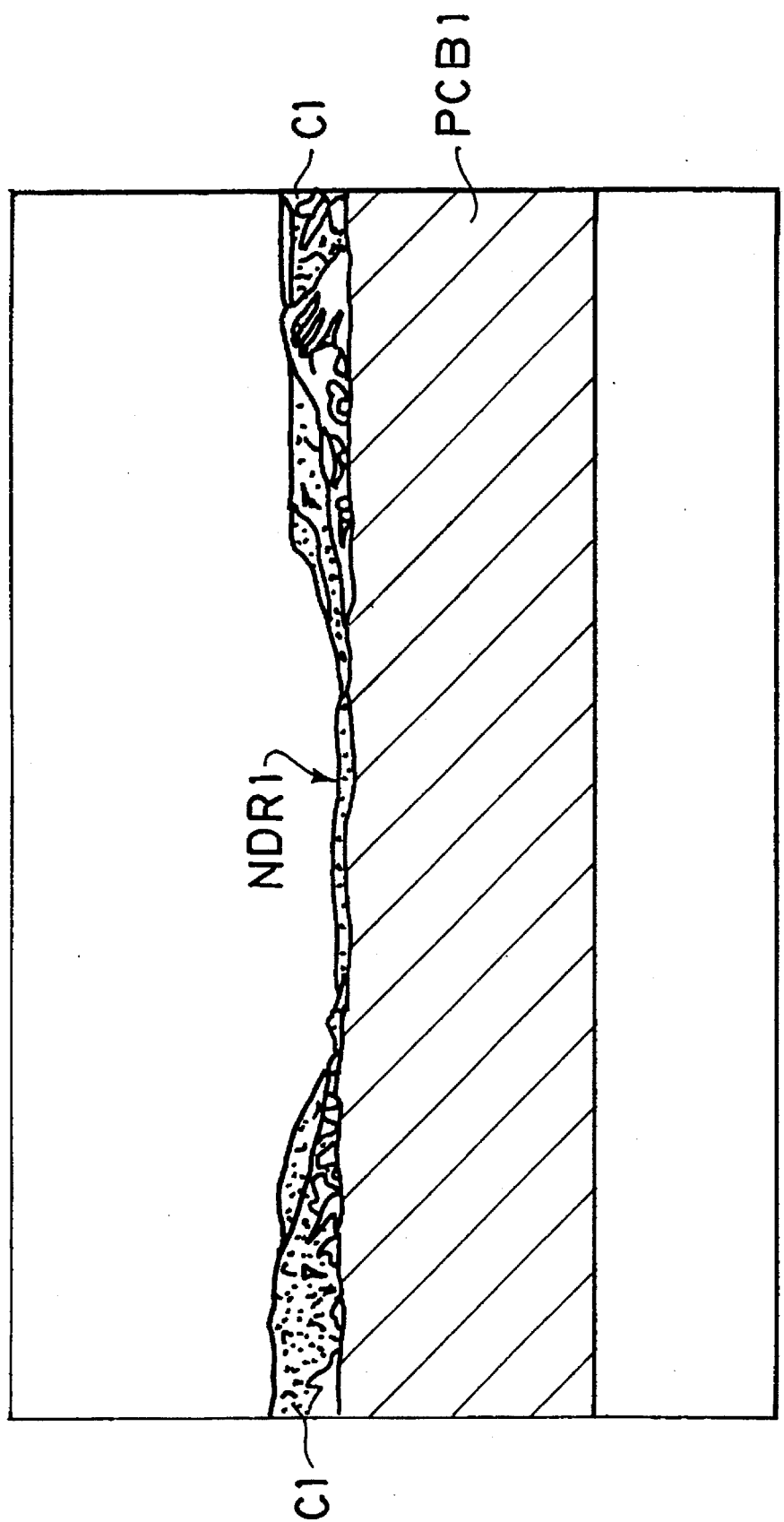
FIG. 1(b) is a side view of the conductor on the printed circuit board with the necked down region shown in FIG. 1(a)
Figure 2:
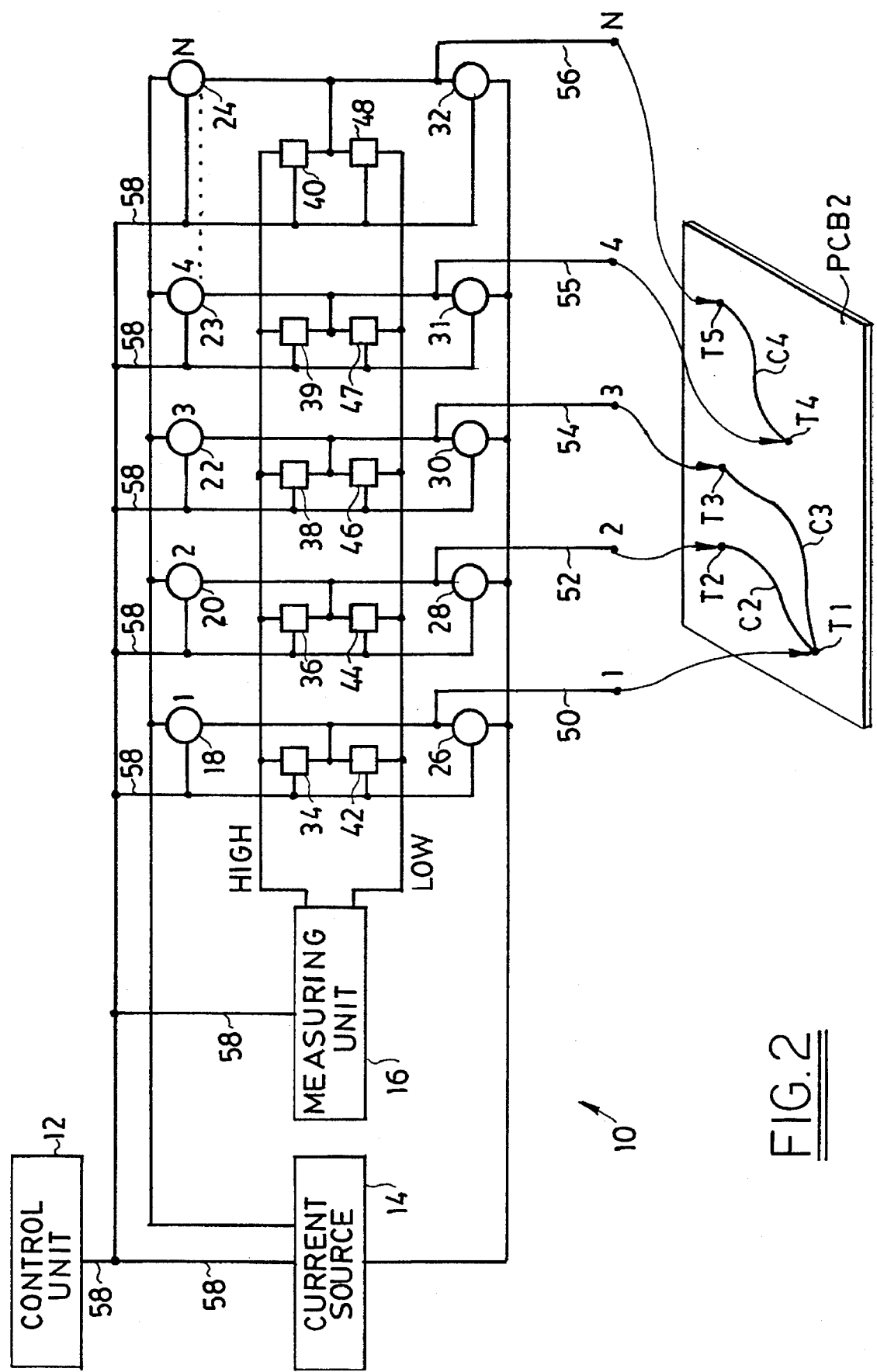
FIG. 2 is a block diagram of a test apparatus in accordance with the present invention.

A test apparatus 10 in accordance with the present invention is illustrated in FIG. 2. Test apparatus 10 includes a control unit 12 which is coupled to a current source 14, a measuring unit 16, a plurality of switches 18, 20, 22, 23, 24, 26, 28, 30, 31, 32, 34, 36, 38, 39, 40, 42, 44, 46, 47, and 48 ("18–48"), and connectors 50, 52, 54, 55, and 56. Test apparatus 10 and method provide an accurate automatic analysis of conductors on printed circuit boards being tested. In particular, test apparatus 10 and method test each conductor for open circuits and areas of reduced cross-sectional area along all or part of their length. Test apparatus 10 and method will not damage printed circuit boards being tested or other acceptable conductors on the printed circuit boards and is dynamic allowing the operator of test apparatus 10 and method to adjust the parameters for identifying defective conductors.

Basically, to test a conductor C2, C3, or C4 on a printed circuit board PCB2, test apparatus 10 and method send a constant current pulse through the conductor for a certain period of time and monitor the voltage drop across the conductor during the duration of the current pulse. An open circuit in the conductor is detected by a lack of current flow. An area of reduced cross sectional area along part or all of the length of the conductor is detected by noting that the conductor will heat up more rapidly than a matching conductor in a reference printed circuit board which does not have a reduced cross sectional area along part or all of its length. The amount of heating in the conductor is determined by monitoring the voltage rise over the time the constant current pulse is applied. As current flows through the conductor, the conductor dissipates power according to the equation: $P=I^2 R$, where P=power in watts; I=current in amps; R=the resistance of the conductor in ohms. In this case, the current is held constant by the apparatus. The power dissipation in the conductor results in a heating and temperature rise in the conductor which typically causes an increase in resistance of the conductor in accordance with the thermal coefficient of resistance for the material from which the conductor is made. This increase in resistance results in a commensurate increase in the voltage drop across the conductor. This characteristic is repeatable and unique for a particular conductor. As energy is absorbed, the conductor heats and the resistance increases and the increase in resistance results in an increase in the voltage drop across the conductor during the duration of the current pulse. The difference between the voltage drop at various times during the constant current pulse provides the voltage rise.

Referring to FIG. 2, control unit 12 is a programmed computer system which executes a set of instructions to identify defective conductors on printed circuit boards. The set of instructions carried out by control unit 12 are set forth in greater detail later. Control lines 58 couple control unit 12 to current source 14, measuring unit 16 and each switch 18–48. Control unit 12 controls the magnitude or amplitude and duration of current pulses output by current source 14, controls the timing of and the type of measurements made by measuring unit 16 and controls which switches 18–48 coupled to current source 14 and measuring unit 16 are open and which are closed.

Current source 14 is coupled through switches 18–48 to connectors 50, 52, 54, 55, and 56. Current source 14 can output a constant current pulse for a time interval to connectors 50, 52, 54, 55, and 56. In this particular embodiment, the constant current pulse can have a constant amplitude between 0.1 to 40.0 amps and a pulse duration of 0.1 to 220 milliseconds. The particular amplitude and duration of the constant current pulse output by current source 14 can be adjusted as necessary for the particular application.

Measuring unit 16 is coupled through switches 18–48 to connectors 50, 52, 54, 55, and 56. In this particular embodiment, measuring unit 16 is a voltmeter and m ammeter which can be coupled by switches 18–48 to be in series or in parallel with each conductor C2, C3, and C4 on printed circuit board PCB2.

Each switch 18–48 is coupled to one end of connectors 50, 52, 54, 55, and 56. In this particular embodiment, switches 18–48 are implemented using field effect transistors although other types switches could be used. The other end of each connector 50, 52, 54, 55, and 56 is adapted to be brought into electrical and mechanical contact with test points T1, T2, T3, T4, and T5 ("T1–T5"). In this particular embodiment, connector 50 is coupled to test point T1, connector 52 is coupled to test point T2, connector 54 is coupled to test point T3, connector 55 is coupled to test point T4, and connector 56 is coupled to test point T5. Test points T1 and T2 are located at the end of conductor C2, test points T1 and T3 are located at the ends of conductor C3, and test points T4 and T5 are located at the ends of conductor C4. Although only five connectors 50, 52, 54, 55 and 56 and three conductors C2, C3, and C4 are shown, test apparatus 10 could have as many connectors as needed and desired to test as many conductors as there were on printed circuit board PCB2. Typically, test apparatus 10 will have about 1500 connectors. Although not shown, a "bed of nails" type fixture could be used to bring connectors 50, 52, 54, 55 and 56 into electrical and mechanical contact with test points T1–T5.

Test apparatus 10 and method operate in two phases to identify conductors which have open circuits or have a reduced cross-sectional area over part or all of their length: a learn routine; and then a test routine.

LEARN ROUTINE

In the learn routine, a reference printed circuit board is selected from two or more printed circuit boards to be tested and then each conductor on the reference printed circuit board is inspected to ensure that each conductor has an acceptable cross-sectional area along its entire length and thus is not defective. In this particular embodiment, a visual inspection is used although other types of inspection techniques could be used.

I. Identification of Conductors on the Reference Printed Circuit Board

Once a reference printed circuit board is located, test apparatus 10 and method identify the location of conductors C2, C3, and C4 on reference print circuit board PCB 2 (which for purposes of illustration at this point is representative of the reference printed circuit board). To identify the location of each conductor, one end of each of connector 50, 52, 54, 55, and 56 is coupled to one of the test points T1, T2, T3, T4, or T5 on reference printed circuit board PCB2. In this particular embodiment, test apparatus 10 has 1500 connectors, of which only connectors 50, 52, 54, 55, and 56 are shown for ease of illustration. Once connectors 50, 52, 54 55, and 56 have been coupled to test points T1–T5, control unit 12 sequentially tests for a connection between each set of two connectors 50, 52, 54, 55, and 56.

First, control unit 12 closes switches 18 and 28 and commands current source 14 to apply a low current pulse between connectors 50 and 52, and commands measuring unit 16 to monitor for any current flow. The amplitude and duration of the low current pulse applied would be selected to be at a level which the conductor with the smallest cross-sectional area on reference printed circuit board PCB2 could withstand. In this particular embodiment, conductor C2 has a cross sectional area of 30 mils$^2$ so a low current pulse having an amplitude of 0.5 amps for 1 milliseconds is used. If current flow between test points T1 and T2 is detected, then measuring unit 16 signals control unit 12 that a conductor C2 has been detected. Control unit 12 stores the location of the identified conductor and then signals current source 14 to turn off the low current pulse, signals measuring unit 16 to stop taking measurements, and opens switches 18 and 28.

Next, control unit 12 closes switches 18 and 30 and commands current source 14 to apply the same low current pulse between connectors 50 and 54, and commands measuring unit 16 to monitor for any current flow. Again, if a current is detected, then measuring unit 16 signals control unit 12 that a conductor has been detected and control unit 12 stores the location of the identified conductor. The process is repeated for all possible combinations of connections between connectors 50, 52, 54, 55, and 56.

When the process is completed, control unit 12 has a first learn file which has the stored location of all of the conductors C2, C3, and C4. An example of such a first learn file is set forth below:

| Starting Test Point | Test Point Coupled to the Starting Test Point |
| --- | --- |
| T1 | T2, T3 |
| T4 | T5 |

Once the first learn file is created, then control unit 12 continues with the learn routine by recording the heating response of conductors C2, C3, and C4 on the reference printed circuit board.

II. Heating Response of Each Conductors on the Reference Printed Circuit Board

A. Constant Current—Heating Response

In this embodiment, control unit 12 commands current source 14 to apply the same constant current pulse for a time interval to each conductor C2, C3, and C4, sequentially. The amplitude or magnitude and the duration of the constant current pulse which is applied to all of the conductors on the reference printed circuit board is less than or equal to the maximum amplitude and duration for a current pulse that the conductor with the smallest cross-sectional area on the reference printed circuit board could withstand. In this particular embodiment, the smallest cross sectional area for a conductor is 30 mils$^2$ so a constant current pulse of 30 amps for 5 milliseconds is used to test the heating response of conductors C2, C3, and C4. Control unit 12 has the location of each conductor C2, C3, and C4 stored in the first learn file. Although in this particular embodiment, a constant current pulse of 30 amps for 5 milliseconds is used, the amplitude and duration of the pulse can be adjusted as needed and desired for the particular type of conductor. The apparatus 10 is fully adjustable for a wide range of conductor geometries.

To test the heating response of conductor C2, control unit 12 closes switches 18, 28, 34 and 44, commands current source 14 to apply the constant current pulse to conductor C2, and commands measuring unit 16 to record the voltage drop across conductor C2 at set intervals. In this particular embodiment, current source 14 applies a constant current pulse of 30 amps for 5 milliseconds and measuring unit 16 measures the voltage drop across conductor C2 at 0.1 millisecond intervals. The voltage drop readings are transmitted by measuring unit 16 to control unit 12. Control unit 12 stores each voltage drop reading in a memory (not shown) and as all of the voltage drop readings are being taken and stored, control unit 12 determines the voltage rise for conductor C2.

As discussed earlier, a voltage rise occurs between the first and last voltage drop readings for conductor C2 because as current flows through conductor C2, conductor C2 absorbs energy. As energy is absorbed, conductor C2 heats and the conductor's resistance increases. The increase in resistance during the duration of the current pulse results in an increase in the voltage drop readings across conductor C2.

In this particular embodiment, the reference voltage rise is calculated by determining the difference between the first and last voltage drop reading, although any other set of two voltage drop readings could be used. For conductor C2, if the first voltage drop reading was 5.5 volts and the last voltage drop reading was 5.7 volts then control unit 12 would subtract 5.5 volts from 5.7 volts to obtain a voltage rise of 0.2 for conductor C2.

Once the voltage rise for conductor C2 is determined, then the heating response of the remaining conductors are determined. Once the heating response of each conductor C2, C3, and C4 has been determined, then control unit 12 will have a second learn file stored which includes the conductor C2, C3, and C4, the first and last voltage drop readings and the voltage rise. One illustrative example of a second learn file is set forth below:

| Conductor | First Voltage Drop | Last Voltage Drop | Voltage Rise |
|---|---|---|---|
| C2 | 5.500 | 5.700 | 0.200 |
| C3 | 4.425 | 4.485 | 0.060 |
| C4 | 3.262 | 3.397 | 0.135 |

Next, control unit 12 determines what deviation above the voltage rise recorded in the second learn file would be acceptable for a conductor in a printed circuit board which is being tested ("test printed circuit board"). In this particular embodiment, control unit 12 allows each conductor on a test printed circuit board to have a voltage rise which is up to 10% higher than the voltage rise recorded in the second learn file. Accordingly, control unit 12 multiplies the voltage rise stored in the second learn file by 1.1 to obtain the maximum voltage rise. The maximum voltage rise permitted for each conductor C2 is added to the second learn file:

| Conductor | First Voltage Drop | Last Voltage Drop | Voltage Rise | Max Voltage Rise |
|---|---|---|---|---|
| C2 | 5.500 | 5.700 | 0.200 | 0.220 |
| C3 | 4.425 | 4.485 | 0.060 | 0.066 |
| C4 | 3.262 | 3.397 | 0.135 | 0.149 |

The amount of deviation from the voltage rise which control unit 12 allows can be adjusted by the operator of the test apparatus 10 to whatever level is desired.

B. Constant Voltage Rise—Heating Response

In an alternative embodiment, control unit 12 commands current source 14 to sequentially apply a constant current pulse to each conductor C2, C3, and C4 and to increase the amplitude of each successive application of the constant current pulse to each conductor C2, C3, and C4 until a set voltage rise is obtained or until a maximum amplitude for the constant current pulse is reached. The maximum amplitude for the constant current pulse depends upon the cross sectional area of each conductor being tested. In this particular embodiment, the constant current pulse has a starting amplitude of 1 amp which is applied for a duration of 5 milliseconds. As with the prior embodiment, control unit 12 has the location of each conductor C2, C3, and C4 to be tested stored in the first learn file.

To test the heating response of conductor C2, control unit 12 closes switches 18, 28, 34, and 44, commands current source 14 to apply a constant current pulse with an initial amplitude, and commands measuring unit 16 to measure the voltage drop across conductor C2 at set time intervals. In this particular example, the initial amplitude of the constant current pulse is 1 amp and the duration of the constant current pulse is 5 milliseconds. Measuring unit 16 measures the voltage drop across conductor C2 at periodic intervals, in this particular embodiment every 0.1 milliseconds. Control unit 12 receives the voltage drop readings from measuring unit 16 and calculates the difference between the first and last voltage drop readings to determine the voltage rise.

Once the voltage rise is calculated, then control unit 12 compares the determined voltage rise with the desired voltage rise. In this particular example, a voltage rise of 0.200 volts is desired. If the determined voltage rise is equal to or within a fixed percentage of the desired voltage rise, then the amplitude and duration of the current pulse is stored in a third learn file and the heating response other conductors C3 and C4 are tested. In this particular embodiment, the determined voltage rise must be within 10% of the desired voltage rise.

If the voltage rise is not equal to or within a fixed percentage of the set voltage rise, then testing of the heating response of conductor C2 continues. Conductor C2 is allowed to cool off for a set period of time. In this particular example, conductor C2 would be allowed to cool for 500 milliseconds.

Once the cool off time period has expired, then control unit 12 commands current source 14 to increase the initial amplitude of the constant current pulse and then to apply the constant current pulse with the increased amplitude to conductor C2. In this particular example, the constant current pulse is increased in increments of 1 amp, although the amount the amplitude of the constant current pulse is increased can vary as desired. Control unit 12 also commands measuring unit 16 to monitor the voltage drop across conductor C2 at the same set time intervals and carries out the same voltage rise calculation and comparison described previously for this embodiment.

Control unit 12 will continue to increase the amplitude of the constant current pulse applied by current source 14 until the determined voltage rise is equal to or within a fixed percentage of the desired voltage rise or a maximum amplitude for the constant current pulse is reached.

When either condition is satisfied, then control unit 12 stores the amplitude of the constant current pulse in a third learn file. Control unit 12 will repeat this process for all of the other conductors C3 and C4. One illustrative example of a third learn file is set forth below:

| Conductor | Current | First Voltage Drop | Last Voltage Drop | Voltage Rise |
|---|---|---|---|---|
| C2 | 20 | 4.800 | 5.000 | 0.200 |
| C3 | 21 | 4.355 | 4.555 | 0.200 |
| C4 | 18 | 4.142 | 4.342 | 0.200 |

Although in this illustrative example of the third learn file, the voltage rise for each conductor is 0.200 volts the voltage rise can vary. For example, if the maximum amplitude for the current pulse for a conductor was reached before the desired voltage rise was obtained, then the determined voltage rise for the maximum amplitude for the current pulse would be recorded by control unit 12 as the voltage rise.

Next, control unit 12 determines what deviation above the voltage rise recorded in the third learn file would be acceptable for a conductor in a printed circuit board which is being tested. In this particular embodiment, control unit 12 will allow a conductor on a printed circuit board being tested to have a voltage rise which is up to 10% higher than the voltage rise recorded in the second learn file. Accordingly in this particular embodiment, control unit 12 multiplies the voltage rise stored in the third learn file by 1.1 to obtain the maximum voltage rise which would be acceptable for each conductor. The maximum voltage rise permitted is added to the third learn file:

| Conductor | Current | First Voltage Drop | Last Voltage Drop | Voltage Rise | Max Voltage Rise |
| --- | --- | --- | --- | --- | --- |
| C2 | 20 | 4.800 | 5.000 | 0.200 | 0.220 |
| C3 | 21 | 4.355 | 4.555 | 0.200 | 0.220 |
| C4 | 18 | 4.142 | 4.342 | 0.200 | 0.220 |

Once test apparatus 10 has completed the learn routine, then the reference printed circuit board is disconnected and a test printed circuit board is connected to the test apparatus 10. For purposes of illustration at this point, printed circuit board PCB2 will now be representative of the test printed circuit board.

TEST ROUTINE

A. Constant Current—Heating Response

One end of connectors 50, 52, 54, 55, and 56 for test apparatus 10 are coupled to test points T1–T5 on test printed circuit board PCB2. Once connectors 50, 52, 54, 55, and 56 are coupled to test points T1–T5, then control unit 12 again uses the first learn file to identify the location of each conductor C2, C3, and C4 on test printed circuit board PCB2 and tests each conductor C2, C3, and C4 sequentially.

To test the heating response of conductor C2, control unit 12 closes switches 18, 28, 34, 44, commands current source 14 to apply the constant current pulse which was used to test all of the conductors on the reference printed circuit board to conductor C2, and commands measuring unit 16 to measure the voltage drop at set time intervals during the constant current pulse. In this particular embodiment, the constant current pulse has an amplitude o30 amps and a duration of 5 milliseconds and measuring unit 16 measures a voltage drop across conductor C2 every 0.1 milliseconds.

Typically, control unit 12 will first conduct a preliminary test to verify the integrity of the connection between connectors 50 and 52 and test points T1 and T2 on the printed circuit board PCB 2 being tested. To perform this preliminary test, control unit 12 compares the first voltage drop reading measured for conductor C2 against the first stored voltage drop reading for the matching conductor on the reference printed circuit board and obtains a difference between the two readings. If the difference is less than or equal to a preset amount, then control unit 12 continues with the test routine. If the difference is greater then the preset amount, then control unit 12 signals an error with either the connections of connectors 50 and 52 to test points T1 and T2 the conductor C2 or, in this particular embodiment, the voltage drop readings of the test board must be within 20% of the learned value.

Next, control unit 12 calculates the voltage rise between the present voltage reading and the first voltage reading to obtain a determined voltage rise and then compares the determined voltage rise against the maximum voltage rise acceptable for the conductor which is stored in the second learn file. If the determined voltage rise exceeds the maximum voltage rise for the conductor, then control unit 12 stops the current pulse and identifies that conductor as defective. In this particular embodiment, the maximum voltage rise for conductor C2 is 0.220 volts. The above described test for heating response is then repeated for each of the conductors C3 and C4 on printed circuit board PCB 2 using the maximum voltage rise stored in the second learn file.

B. Constant Voltage Rise—Heating Response

To test the heating response of conductor C2, control unit 12 selects the amplitude of the current pulse stored in the third learn file which achieved the desired voltage rise or was the maximum allowable current pulse for the particular conductor. In this particular embodiment, the amplitude of the constant current pulse for conductor C2 was 20 amps.

Once the proper amplitude for the constant current pulse is selected, then control unit 12 signals switches 18, 28, 34, and 44 to close, commands current source 14 to apply the constant current pulse stored in the third learn file to conductor C2, which is 20 amps in this particular example, and commands measuring unit 16 to measure the voltage drop across conductor C2 at set time intervals.

Again, control unit 12 may conduct the preliminary test described above to verify the integrity of the connection between connectors 50 and 52 and test points T1 and T2 on the printed circuit board PCB 2 being tested may be conducted. If the outcome of the preliminary test is satisfactory, then current source 14 continues to output the constant current pulse and measuring unit 16 continues to measure voltage drop readings across the conductor C2 at the same set intervals used during the learn routine and transmits them to control unit 12.

Control unit 12 receives the voltage drop readings and calculates the voltage rise between the two voltage drop readings selected for determining the voltage rise during the learn routine and compares the determined voltage rise against the maximum voltage rise acceptable for conductor C2 stored in the third learn file. If the determined voltage rise exceeds the maximum voltage rise for conductor C2, then control unit 12 identifies conductor C2 as defective. In this particular embodiment, the maximum voltage rise for conductor C2 is 0.220 volts. The above described test for heating response is then repeated for each of the conductors C3 and C4 on printed circuit board PCB 2 using the amplitude of the constant current pulse and the maximum voltage rise stored in the third learn file.

Having thus described the basic concept of the invention, it will be readily apparent to those skilled in the art that the foregoing detailed disclosure is intended to be presented by way of example only, and is not limiting. Various alterations, improvements and modifications will occur and are intended to those skilled in the art, though not expressly stated herein. These modifications, alterations and improvements are intended to be suggested hereby, and are within the spirit and scope of the invention. Accordingly, the invention is limited only by the following claims and equivalents thereto.

What is claimed is:

1. A method for testing each conductor in one or more test printed circuit boards using a reference printed circuit board whose conductors have been determined to be acceptable, said method comprising the steps of:

generating a set of reference voltage rises, each reference voltage rise in the set associated with one conductor on the reference printed circuit board and representing the difference between a first voltage drop reading and a subsequent voltage drop reading taken across that one conductor while a constant current pulse is applied;

generating a set of test voltage rises, each test voltage rise in the set associated with one conductor on the test printed circuit board and representing the difference between the first and the subsequent voltage drop readings taken across that one conductor while the constant current pulse is applied; and comparing the test voltage rise for each conductor on the test printed circuit board against the reference voltage rise for the corresponding conductor on the reference printed circuit board to determine if the test voltage rise exceed the reference voltage rise and if the test voltage rise exceeds the reference voltage rise, then identifying the conductor as defective.

2. The method according to claim 1 further comprising the steps of:

multiplying each reference voltage rise by a set factor to establish a table of adjusted reference voltage rises; and comparing the test voltage rises against the corresponding adjusted reference voltage rises to determined if the test voltage rises exceed the adjusted reference voltage rises and if the test voltage rise exceeds the reference voltage rise, then identifying the conductor as defective.

3. The method according to claim 1 further comprising the steps of:

comparing an initial recorded voltage drop reading taken across each conductor on the reference printed circuit with the initial recorded voltage drop reading for the corresponding conductor on the test printed circuit board to obtain a first difference; and determining if the first difference is within a set range above or below said initial recorded voltage drop.

4. The method according to claim 1 further comprising the step of inspecting the conductors on the reference printed circuit board to ensure that the cross sectional width of each conductor is acceptable.

5. The method according to claim 1 further comprising the steps of:

checking for current flow in each of the conductors on the test printed circuit board; and stopping said constant current pulse in each conductor which has an open circuit.

6. The method according to claim 1 further comprising the steps of:

identifying each test point located at the end of each conductor on the reference printed circuit board;

selecting a first test point;

checking for electrical continuity between the first test point and each other test point on the reference printed circuit board; and creating a file of which test points have continuity.

7. A method for testing each conductor in one or more test printed circuit boards using a reference printed circuit board whose conductors have been determined to be acceptable, said method comprising the steps of:

generating a set of amplitudes for a constant current pulse, each amplitude in the set associated with one conductor on the reference printed circuit board and representing the amplitude which generates a determined voltage rise in that one conductor that is within a set range of a desired voltage rise for that one conductor, each determined voltage rise representing the difference between a first and a second voltage drop reading taken across each conductor while the constant current pulse is applied;

generating a set of test voltage rises, each test voltage rise associated with one conductor on the test printed circuit board and representing the difference between the first and the second voltage drop readings taken across that one conductor when the constant current pulse with the amplitude from the set of amplitudes for the corresponding conductor on the reference printed circuit board is applied to that one conductor; and comparing the test voltage rise for each conductor on the test printed circuit board against the desired voltage rise for the corresponding conductor on the reference printed circuit board to determine if the test voltage rise exceed the desired voltage rise and if the test voltage rise exceeds the desired voltage rise, then identifying the conductor as defective.

8. The method according to claim 7 wherein said step of generating a set of amplitudes further comprises the steps:

comparing each amplitude in the set against a maximum amplitude for each conductor; and storing the maximum amplitude as the amplitude for each conductor in the set whose amplitude exceeds the maximum amplitude.

9. The method according to claim 7 further comprising the steps of:

multiplying each desired voltage rise by a set factor to establish a table of adjusted reference voltage rises; and comparing the test voltage rises against the corresponding adjusted desired voltage rises to determined if the test voltage rises exceed the adjusted reference voltage rises and if the test voltage rise exceeds the reference voltage rise, then identifying the conductor as defective.

10. The method according to claim 7 further comprising the steps of:

comparing an initial recorded voltage drop reading taken across each conductor on the reference printed circuit with the initial recorded voltage drop reading for the corresponding conductor on the test printed circuit board to obtain a first difference; and determining if the first difference is within a set range above or below said initial recorded voltage drop.

11. The method according to claim 7 further comprising the step of inspecting the conductors on the reference printed circuit board to ensure that the cross sectional width of each conductor is acceptable.

12. The method according to claim 7 further comprising the steps of:

checking for current flow in each conductors on the test printed circuit board; and stopping said constant current pulse in each conductor which has an open circuit.

13. The method according to claim 7 further comprising the steps of:

identifying each test point located at the end of each conductor on the reference printed circuit board;

selecting a first test point;

checking for electrical continuity between the first test point and each other test point on the reference printed circuit board; and creating a file of which test points have continuity.

14. An apparatus for testing each conductor in one or more test primed circuit boards using a reference printed circuit board whose conductors have been determined to be acceptable, said apparatus comprising:

means for generating a set of reference voltage rises, each reference voltage rise in the set associated with one conductor on the reference printed circuit board and representing the difference between a first voltage reading and a subsequent voltage drop reading taken across that one conductor while a constant current pulse is applied;

means for generating a set of test voltage rises, each test voltage rise in the set associated with one conductor on the test printed circuit board and representing the difference between the first and the subsequent voltage drop readings taken across that one conductor while the constant current pulse is applied; and means for comparing the test voltage rise for each conductor on the test printed circuit board against the reference voltage rise for the corresponding conductor on the reference printed circuit board to determine if the test voltage rise exceed the reference voltage rise and if the test voltage rise exceeds the reference voltage rise, then identifying the conductor as defective.

15. The apparatus according to claim 14 further comprising:

means for multiplying each reference voltage rise by a set factor to establish a table of adjusted reference voltage rises; and means for comparing the test voltage rises against the corresponding adjusted reference voltage rises to determined if the test voltage rises exceed the adjusted reference voltage rises and if the test voltage rise exceeds the reference voltage rise, then identifying the conductor as defective.

16. The apparatus according to claim 14 further comprising:

means for comparing an initial recorded voltage drop reading taken across each conductor on the reference printed circuit with the initial recorded voltage drop reading for the corresponding conductor on the test printed circuit board to obtain a first difference; and means for determining if the first difference is within a set range above or below said initial recorded voltage drop.

17. The apparatus according to claim 14 further comprising means for inspecting the conductors on the reference printed circuit board to ensure that the cross sectional width of each conductor is acceptable.

18. The apparatus according to claim 14 further comprising:

means for checking for current flow in each of the conductors on the test printed circuit board; and means for stopping said constant current pulse in each conductor which has an open circuit.

19. The apparatus according to claim 14 further comprising:

means for identifying each test point located at the end of each conductor on the reference printed circuit board;

means for selecting a first test point;

means for checking for electrical continuity between the first test point and each other test point on the reference printed circuit board; and means for creating a file of which test points have continuity.

20. An apparatus for testing each conductor in one or more test primed circuit boards using a reference printed circuit board whose conductors have been determined to be acceptable, said apparatus comprising:

means for generating a set of amplitudes for a constant current pulse, each amplitude in the set associated with one conductor on the reference printed circuit board and representing the amplitude which generates a determined voltage rise in that one conductor that is within a set range of a desired voltage rise for that one conductor, each determined voltage rise representing the difference between a first voltage drop reading and a subsequent voltage drop reading taken across each conductor while the constant current pulse is applied;

means for generating a set of test voltage rises, each test voltage rise associated with one conductor on the test printed circuit board and representing the difference between the first and the subsequent voltage drop readings taken across that one conductor when the constant current pulse with the amplitude from the set of amplitudes for the corresponding conductor on the reference printed circuit board is applied to that one conductor; and means for comparing the test voltage rise for each conductor on the test printed circuit board against the desired voltage rise for the corresponding conductor on the reference printed circuit board to determine if the test voltage rise exceed the desired voltage rise and if the test voltage rise exceeds the desired voltage rise, then identifying the conductor as defective.

21. The apparatus according to claim 20 wherein said means for generating a set of amplitudes further comprises:

means for comparing each amplitude in the set against a maximum amplitude for each conductor; and means for storing the maximum amplitude as the amplitude for each conductor in the set whose amplitude exceeds the maximum amplitude.

22. The apparatus according to claim 20 further comprising:

means for multiplying each desired voltage rise by a set factor to establish a table of adjusted reference voltage rises; and means for comparing the test voltage rises against the corresponding adjusted desired voltage rises to determined if the test voltage rises exceed the adjusted reference voltage rises and if the test voltage rise exceeds the reference voltage rise, then identifying the conductor as defective.

23. The apparatus according to claim 20 further comprising:

means for comparing an initial recorded voltage drop reading taken across each conductor on the reference printed circuit with the initial recorded voltage drop reading for the corresponding conductor on the test printed circuit board to obtain a first difference; and means for determining if the first difference is within a set range above or below said initial recorded voltage drop.

24. The apparatus according to claim 20 further comprising means for inspecting the conductors on the reference printed circuit board to ensure that the cross sectional width of each conductor is acceptable.

25. The apparatus according to claim 20 further comprising:

means for checking for current flow in each conductors on the test printed circuit board; and means for stopping said constant current pulse in each conductor which has an open circuit.

26. The apparatus according to claim 20 further comprising:

means for identifying each test point located at the end of each conductor on the reference printed circuit board;

means for selecting a first test point;

means for checking for electrical continuity between the first test point and each other test point on the reference printed circuit board; and means for creating a file of which test points have continuity.

* * * * *